(12) United States Patent
Su (10) Patent No.: US 7,133,791 B1
(45) Date of Patent: Nov. 7, 2006

(54) TWO-MEAN LEVEL-CROSSING TIME INTERVAL ESTIMATION METHOD

(75) Inventor: Wei Su, Englishtown, NJ (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 91 days.

(21) Appl. No.: 11/102,447

(22) Filed: Mar. 31, 2005

(51) Int. Cl.
*G06F 15/00* (2006.01)
*G01D 18/00* (2006.01)
*H03F 1/26* (2006.01)

(52) U.S. Cl. .................. 702/89; 702/189; 702/190; 235/462.19; 375/350; 708/300

(58) Field of Classification Search .............. 702/79, 702/89, 69, 74, 75, 189, 190, 194; 375/371, 375/373, 316, 328, 334, 350; 235/462.16, 235/462.19, 462.25; 708/300, 306, 805, 708/819, 836
See application file for complete search history.

(56) References Cited

U.S. PATENT DOCUMENTS 5,835,541 A * 11/1998 Namekata et al. .......... 375/355
7,092,472 B1 * 8/2006 Stojanovic ................ 375/371
2001/0037189 A1 * 11/2001 Onu et al. .................. 702/191

* cited by examiner

Primary Examiner—Bryan Bui
(74) Attorney, Agent, or Firm—Michael Zelenka; George B. Tereschuk (57) ABSTRACT

N-sample level-crossing estimator methods and devices are provided that extract more information from given time samples than the current two-sample approach and that are more resistant to interference from noises. The two-mean level-crossing time-interval estimation method extracts more information from given time samples than existing methods, advantageously estimates a level-crossing time interval with a limited number of time samples and is quieter than current noisy estimation techniques. The two-mean level crossing time-interval estimation method for N-sample estimation uses all N time samples by calculating the mean value of the first N/2 time samples and subtracting it by the second N/2 time sample to average out the noises in time samples. The two-mean level crossing time-interval estimation method can be implemented by using a Finite Impulse Response filter to take level-crossing time samples as inputs, take the differential level-crossing time samples as inputs, or take the N/2-step differential level-crossing time-interval as an input. An addition only one-step differential level-crossing time-interval estimator device and a one-step differential level-crossing time-interval estimator device are also provided.

20 Claims, 5 Drawing Sheets

TWO-MEAN LEVEL-CROSSING TIME INTERVAL ESTIMATION METHOD

GOVERNMENT INTEREST

The invention described herein may be manufactured, used, imported and licensed by or for the Government of the United States of America without the payment to me of any royalty thereon.

FIELD OF THE INVENTION

This invention relates generally to the field of signal frequency estimation. In particular, the present invention relates to a two-mean level-crossing time interval and signal frequency estimation technique.

BACKGROUND OF THE INVENTION

Level-crossing time interval estimation techniques can be useful for signal frequency estimation, rotation angular velocity estimation and signal modulation classification. The time interval between two level-crossing points of a periodic function can be estimated by using a moving average of the level-crossing time samples. Current level-crossing time interval estimation techniques are based on a certain number of important mathematical expressions.

Assuming that the signal $g(x)$ is periodic in a given time domain $x_L \leq x \leq x_R$ and also assume that signal $g(x)$ has N number of level-crossing time samples, or measurements, $x(k), x(k-1), \ldots, x(k-N+1)$ between $x_L$ and $x_R$ such that $g[x(k)]=g[x(k-1)]=\ldots=g[x(k-N+1)]=E$, where E is a given level for measuring crossings. If $E=0$, the time samples $x(k), x(k-1), \ldots, X(k-N+1)$ are considered to be zero-crossing points. The time interval between two level-crossing time samples, $x(k)$ and $x(k-v)$, is then defined as v-step differential level-crossing time-interval, denoted by the expression:

$$y(k,v)=x(k)-x(k-v), \quad (1)$$

where $1 \leq vV \leq N-1 \ldots$ is a positive integer. Since the function $g(x)$ is noisy in practice, the level-crossing time interval will be estimated by taking the time average of:

$$y(k,1)=x(k)-x(k-1) \quad (2)$$

as shown below, $$m(k, N-1) = \frac{1}{N-1}\sum_{j=0}^{N-2} y(k-j, 1) \quad (3)$$

Substituting Equation 2 into equation 3, the level-crossing time interval estimation is:

$$m(k, N-1) = \frac{x(k) - x(k-N+1)}{N-1} = \frac{1}{N-1}y(k, N-1) \quad (4)$$

For N given time samples, $x(k), x(k-1), \ldots, x(k-N+1)$, the estimation in Equation 4 uses only the first and the last samples, $x(k-N+1)$ and $x(k)$, and all other time samples $x(k-1), x(k-2), \ldots, x(k-N+2)$ are not counted. Therefore, the current estimation technique is based on only two samples so that the information in all other N-2 time samples is not utilized. This is known as two-sample estimation.

There are a number of disadvantages, shortcomings and limitations with the current two-sample estimation technique. One problem with the current two-sample estimation technique is that it only uses two samples at a time, so that the information from numerous other given time samples is not accessed and used. Another problem with the current two-sample estimation technique is that noises in samples $x(k-N+1)$ and $x(k)$ from various sources, such as electronic components, interference in transmission or even thermal noise, will directly affect the two-sample estimation result of $m(k,N-1)$. Thus, there has been a long-felt need for other estimating techniques and devices that are quieter and extract more information from given time samples than the current two-sample approach.

The long-felt need for new time estimation techniques has now been answered with N-sample level-crossing estimator methods and devices that extract more information from given time samples than the current two-sample approach and that are more resistant to interference from noises. The two-mean level-crossing time-interval and signal frequency estimation method of the present invention extracts more information from given time samples than existing methods, can advantageously estimate a level-crossing time interval with a limited number of time samples and is more accurate than the inefficient and noisy prior art estimation techniques. The present invention also encompasses addition only one-step differential level-crossing time-interval estimator and one-step differential level-crossing time-interval estimator devices that are less noisy than inefficient prior art estimation techniques.

SUMMARY OF THE INVENTION

It is an object of the present invention to provide a method for two-mean level-crossing time-interval estimation.

It is still another object of the present invention to provide a method for two-mean level-crossing time-interval and signal frequency estimation that extracts more information from a greater number of samples.

It is also an object of the present invention to provide an addition only one-step differential level-crossing time-interval estimator device that extracts more information from a greater number of samples and is less noisy than prior art techniques.

It is still a further object of the present invention to provide a one-step differential level-crossing time-interval estimator device that extracts more information from a greater number of samples and is less noisy than prior art techniques.

These and other objects and advantages are accomplished with this invention's two-mean level crossing time-interval and signal frequency estimation method for N-sample estimation. The new technique uses all N time samples by calculating the mean value of the first N/2 time samples and subtracting it by the second N/2 time sample to average out the noises in time samples. The two-mean level crossing time-interval estimation method can be implemented by using a Finite Impulse Response ("FIR") filter to take level-crossing time samples as inputs, take the differential level-crossing time samples as inputs, or take counter outputs as an input. The present invention contemplates this N time sample estimation method, an addition only one-step differential level-crossing time-interval estimator device and a one-step differential level-crossing time-interval estimator device.

DETAILED DESCRIPTION OF THE DRAWINGS

Figure 1:
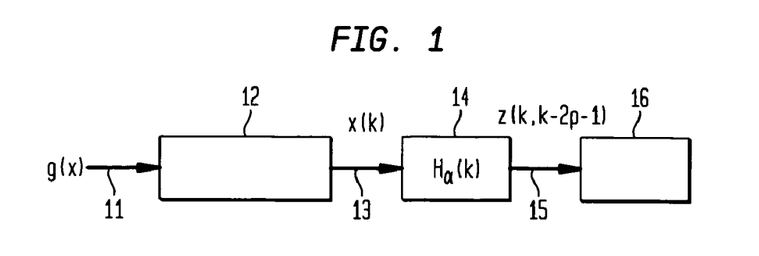
FIG. 1 is a flow diagram depicting a simplified N-sample time estimator device.

Referring now to the drawings, FIG. 1 is a conceptual flow diagram depicting a basic N-sample time estimator showing a signal g(x) 11 being sent to a level-crossing sampler 12 so that the level-crossing time, x(k), represented by arrow 13, is sampled and recorded whenever the value of the signal g(x) 11 equals a given level E, so that signal g(x)=E. Level-crossing time samples, x(k), x(k−1), . . . x(k−2p−1), are inputs to the $H_\alpha(k)$ filter 14 resulting in estimating an average time difference z(k,k−2p−1), represented by arrow 15, between two consecutive time samples and an estimated level-crossing time interval output 16.

Figure 2:
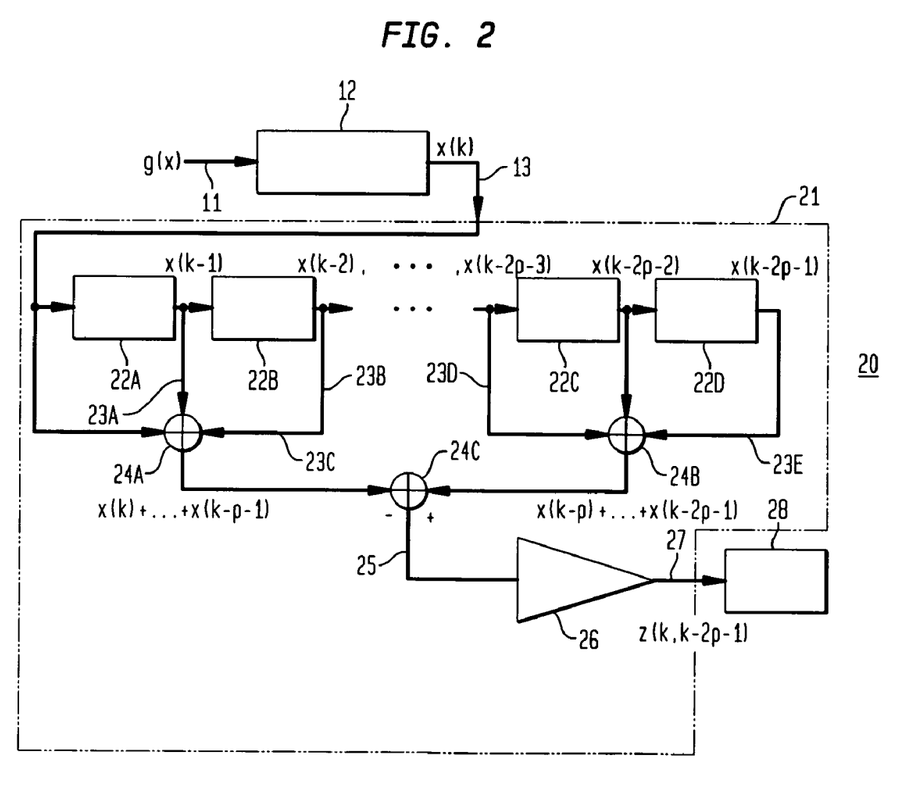
FIG. 2 is a flow diagram of a tow-mean N sample time-interval estimator device in accordance with the present invention.

Referring now to FIG. 2, which depicts a two-mean N-sample time interval estimator device 20 that is a more detailed implementation of the FIG. 1 N-sample time interval estimator, where like numerals are employed for similar structures. Signal g(x) 11 is shown being sent to level-crossing sampler 12. Giving N=2(p+1) number of samples: x(k), . . . , x(k−p), x(k−p−1), . . . , and x(k−2p−1), where p=1, 2, . . . is a positive integer, a time sequence input 13 is provided to a means for filtering 21, and as shown in FIG. 1, the output of the filtering means, arrow 15, is a time interval estimated output according to the equation:

$$z(k, k-2p-1) = \frac{1}{(p+1)^2} \sum_{j=0}^{2p+1} \alpha(j)x(k-j), \quad (5)$$

Referring now back to FIG. 2, the filtering means 21, further comprising 2p+1 number of shift registers 22A–22D, adders 24A–24C, amplifier 26, and coefficients of {−1,−1, . . . , 1, 1}, generates an N-sample level crossing time interval having the formula:

$$z(k, k-2p-1) = \frac{1}{(p+1)^2}\left[\sum_{i=0}^{p} x(k-i) - \sum_{i=0}^{p} x(k-i-p-1)\right] \quad (6)$$

Shift registers 22A–22D store digital data, such as memory, each being controlled by a timing clock, which shifts out the current stored data at the output and stores new data from the time sample inputs. Shift registers 22A–22D provide shift register outputs 23A–23E to adders 24A–24C, which electronically add signals, or pieces of data, together. Unlike the prior art, the N-sample level-crossing time interval of Equation 6 is then estimated by two mean values, $$\sum_{i=0}^{p} x(k-i) \text{ and } \sum_{i=0}^{p} x(k-i-p-1),$$

so that electronic noises in time samples: x(k), . . . , x(k−p), x(k−p−1), . . . , and x(k−2p−1) will be averaged out to yield an increased accuracy N-sample level-crossing time interval estimate that is included in a filtered output 25 to amplifier 26. Amplifier 26 provides gain adjustment and calibration to the filtered output 25, which results in an average time difference z(k,k−2p−1) 27 and an estimated level-crossing time interval output, represented by box 28, that are more accurate than prior art estimation techniques because of the higher number of samples used. The filtering means 21 may be processed by a FIR filter.

Because the range of time difference sample x(k) within time sequence input 13 is very large, the differential time of Equation 1 may be used to simplify the operation. Equation 6 can be rearranged as follows:

$$z(k, k-2p-1) = \frac{1}{(p+1)^2}\sum_{i=0}^{p}[x(k-i) - x(k-i-p-1)] \quad (7)$$

and by substituting Equation 1 into Equation 7 one obtains:

$$z(k, k-2p-1) = \frac{1}{(p+1)^2}\left[\sum_{i=0}^{p} y(k-i, p+1)\right] \quad (8)$$

Figure 3:
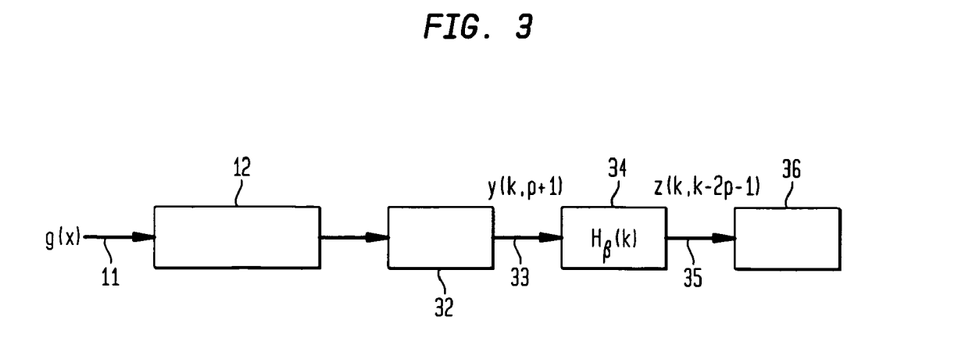
FIG. 3 is a flow diagram depicting a simplified N/2 step differentiator level-crossing estimator device.
Figure 4:
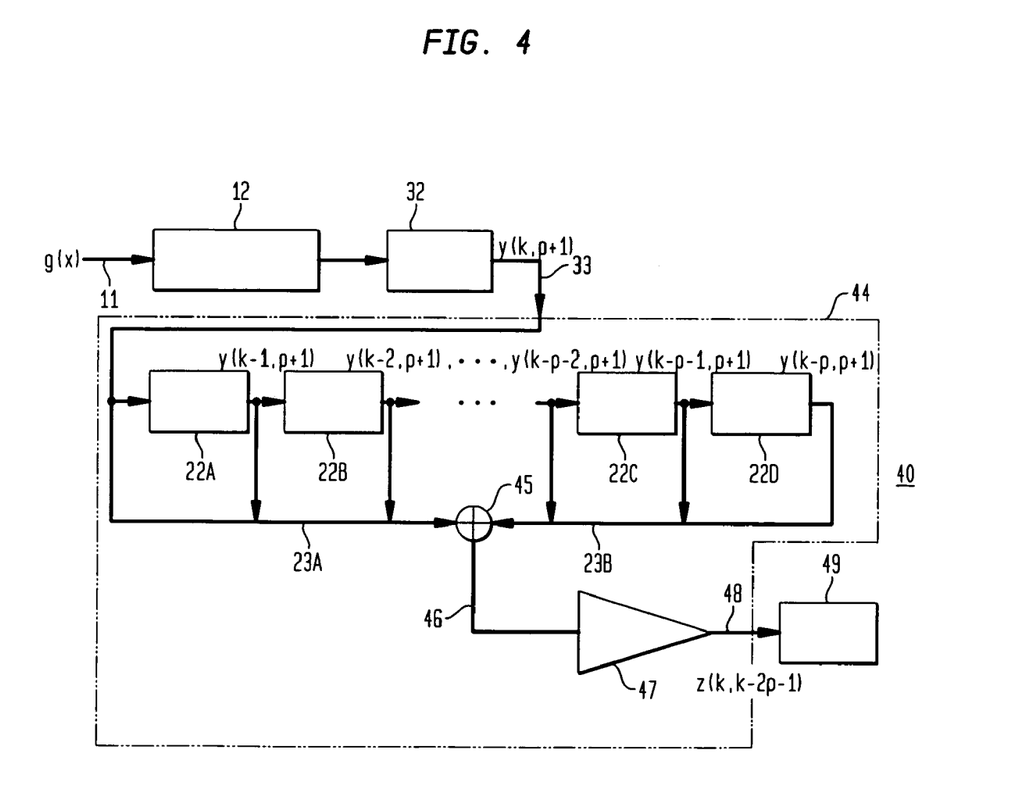
FIG. 4 is a flow diagram depicting an N/2-step differentiator type of level-crossing time-interval estimator in accordance with the present invention.

Equation 8 represents one alternative implementation of the two-mean level-crossing time interval estimation, as shown in FIGS. 3 and 4, which depict an N/2-step differentiator type of level-crossing time-interval estimator. Referring now to FIG. 3, where like numerals are employed for like structures, there is depicted a basic N/2-step differentiator type of level-crossing time-interval estimator comprising a signal g(x) 11 being sent to a level-crossing sampler 12, a differentiator 32 and a moving average filter 34. In this embodiment, the time difference between two time samples y(k,p+1)=x(k)−x(k−p−1) is a time sequence input 33 provided to filter 34. Filter 34 estimates an average level-crossing time difference z(k,k−2p−1), represented by arrow 35, and an estimated level-crossing time interval, represented by box 36, is generated.

Referring now to FIG. 4, which depicts an N/2-step differentiator type of level-crossing time-interval estimator device 40 that is a more detailed implementation of the FIG. 3 estimator, where like numerals are employed for like structures. The N/2-step differentiator level-crossing time-interval estimator device 40 may be implemented by using multiple shift registers or other means to generate 2(k,k−2p−1). The N/2-step differentiator type of level-crossing time-interval estimator device 40 further comprises a level-crossing sampler 12, a differentiator 32 and a means for filtering 44. The filtering means 44 further comprises p number of shift registers 22A–22D, which provide shift register outputs 23A and 23B to p+1 inputs adder 45, so that a multiplier is not required and an amplifier 47.

In this device, the N/2-step differential level-crossing time-interval y(k,p+1) provides a time sequence input 33 for the filtering means 44. Adder 45 sends a filtered output 46 to amplifier 47 that provides gain adjustment and calibration for the average level-crossing time difference z(k,k−2p−1) 48, resulting in an estimated level-crossing time interval output 49. The average level-crossing time difference z(k,k−2p−1) 48 is defined in Equation 8, above. The filtering means 44 can also be a moving average filter or a FIR filter.

Figure 5:
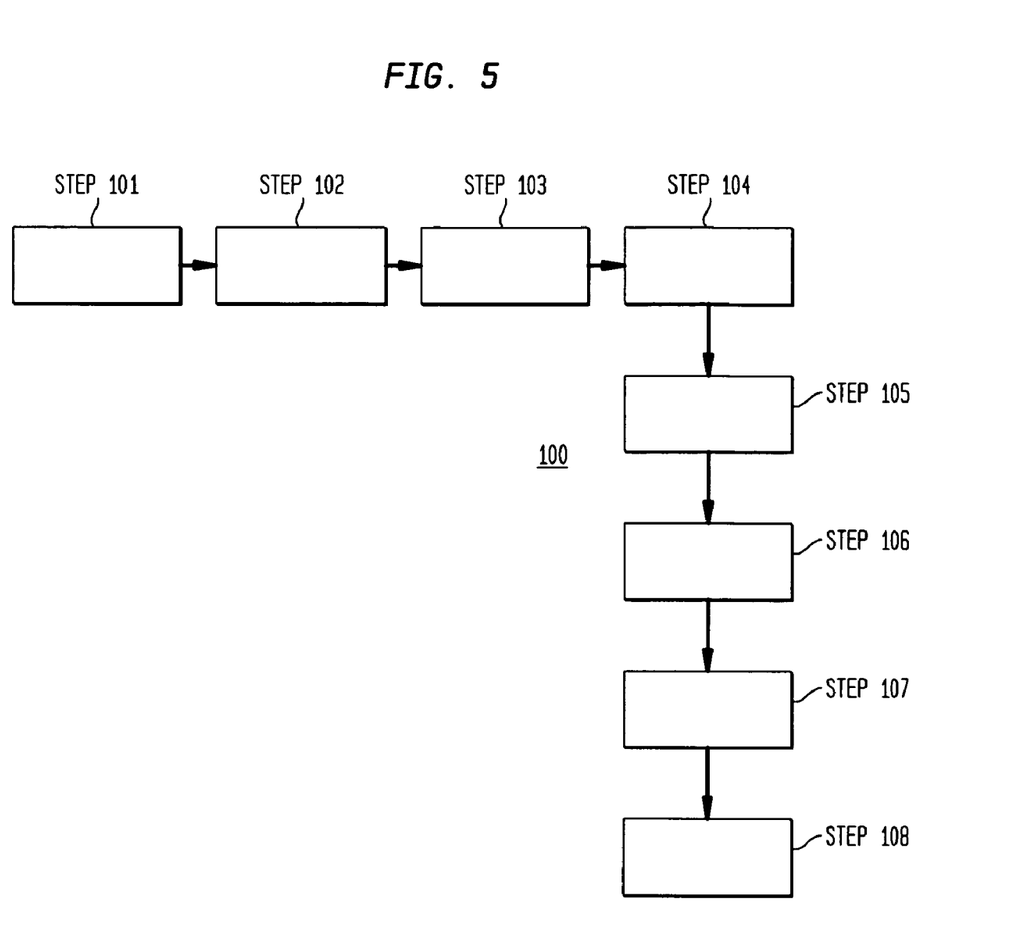
FIG. 5 is a flow diagram depicting the steps of the method for two-mean estimating level-crossing time intervals of the present invention.

Referring now to the drawings, FIG. 5 depicts the steps of the method for two-mean estimating level-crossing time intervals and signal frequency estimation 100 of the present invention. Step 101 is a collecting step for collecting a group of time difference samples from a signal g(x). The group of time difference samples further comprise N=2p+1 number of consecutive time samples x(k), x(k−1), . . . x(k−2p−1), where p=1, 2 . . . and is a positive integer, and electronic noise. Step 102 is a generating a time sequence input step, where the time sequence input from the collected time difference samples is generated for a means for filtering. Step 103 is a first calculating step during which a time interval estimate output is calculated in the filtering means, the filtering means having 2p+1 number of shift registers, a group of adders, an amplifier and a set of coefficients $\alpha(j)=\{-1, -1, \ldots, 1, 1\}$, the time interval estimate output having the same formula as Equation No. 5. Step 104 is a providing step where a series of shift register outputs are provided by the shift registers to the adders. Step 105 is a generating step to generate an increased accuracy N-sample level-crossing time interval estimate from estimating said N-sample level crossing time interval by two mean values, $$\sum_{i=0}^{p} x(k-i) \text{ and } \sum_{i=0}^{p} x(k-i-p-1),$$

and averaging out the electronic noises. Step 106 is a sending step for sending a filtered output to an amplifier, the filtered output including the increased accuracy N-sample level-crossing time interval estimate. Step 107 is a calibrating and gain adjusting step where the amplifier provides a calibration and gain adjustment to the filtered output and Step 108 is a second providing step during which an average time difference z(k,k−2p−1) and an estimated level-crossing time interval output from the increased accuracy N-sample level-crossing time interval estimate are provided. The step 105 generating step can be implemented with any number of inputs, including level-crossing time samples and differential level-crossing time samples.

Figure 6:
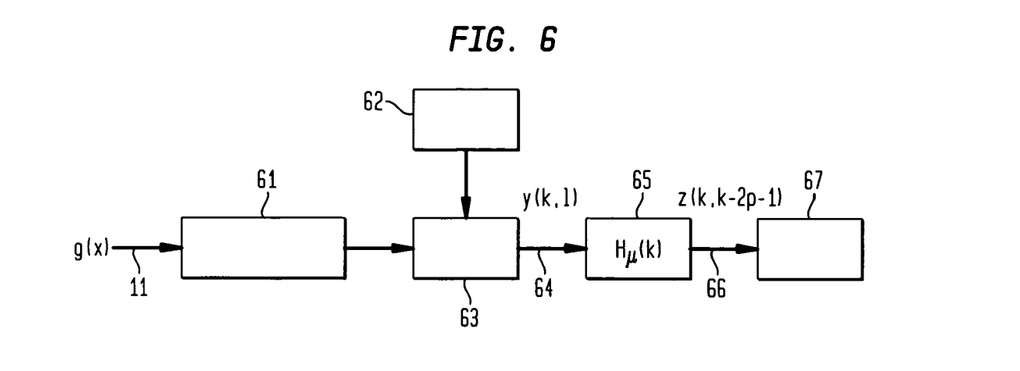
FIG. 6 is a flow diagram depicting a simplified one-step differential level-crossing time-interval estimator device.
Figure 7:
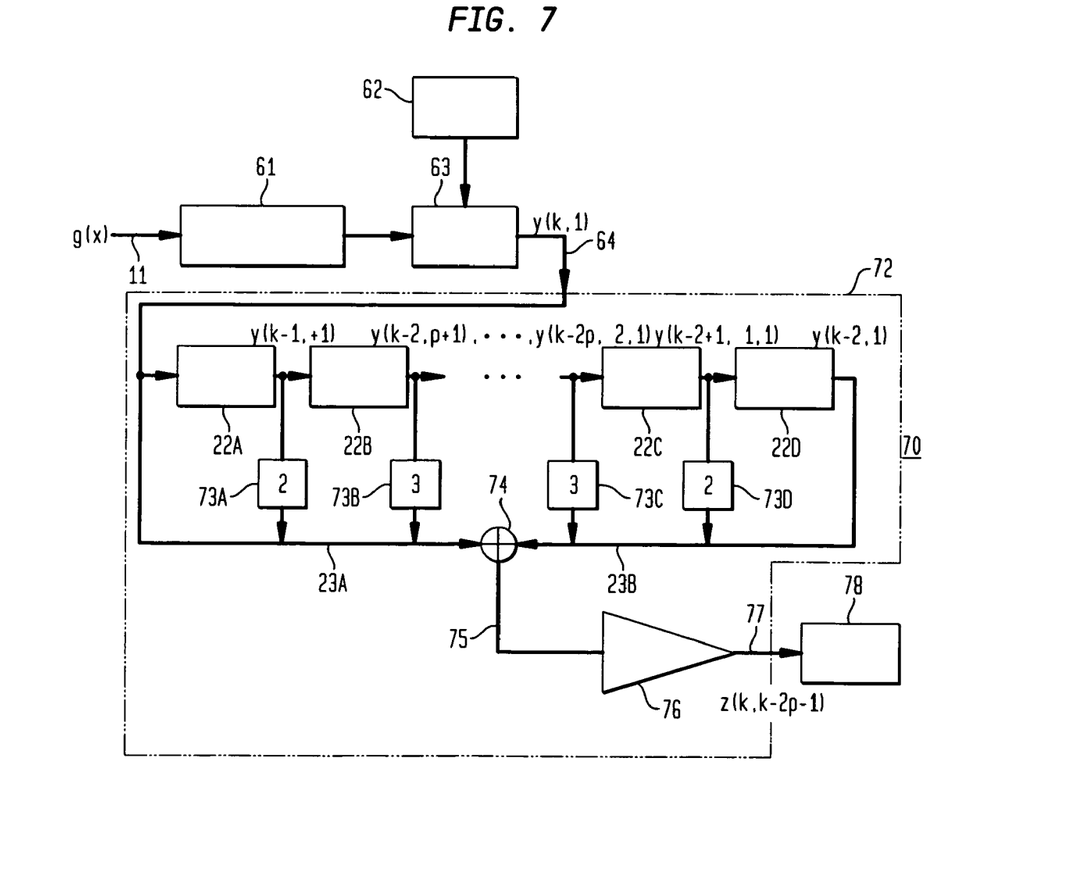
FIG. 7 is a flow diagram depicting a one-step differential level-crossing time-interval estimator device in accordance with the present invention.

The present invention also encompasses the one-step embodiments of differential N-sample time interval estimators depicted in FIGS. 6 and 7. In practice, it may be easier to measure the difference between two consecutive time samples y(k,1), rather than to measure either x(k) or y(k,p+1). FIG. 6 is a conceptual flow diagram of a simplified one-step differential level-crossing time-interval estimator, comprising a signal g(x) 11 being sent to a level-crossing detector 61 to detect a level-crossing event, a local oscillator 62, a counter 63 and a FIR $H_\mu(k)$ filter 65.

FIG. 7 depicts a one-step differential level-crossing time-interval estimator 70 that is a more detailed implementation of the FIG. 6 estimator, with like numerals being used for similar structures. The FIG. 7 one-step differential level-crossing time-interval estimator 70 of the present invention comprises a signal g(x) 11 being sent to a level-crossing detector 61, a local oscillator 62, a counter 63 and a means for filtering 72. Local oscillator 62 functions as a timer used to measure the time difference between two time samples collected from a plurality of time difference samples. A time-interval input 64 is provided to the filtering means 72. The filtering means 72 further comprises N−2 shift registers 22A–22D, N−3 multiplications 73A–73D, shift register outputs 23A and 23B, N−1 adder 74 and an amplifier 76, and is implemented as shown in FIG. 7 by using Equation 2 and rearranging Equation 7, as follows:

$$z(k, k-2p-1) = \frac{1}{(p+1)^2} \sum_{j=0}^{2p} \mu(j) y(k-j, 1), \qquad (9)$$

with an impulse response of $\mu(j)=\{1, 2, \ldots, p, p+1, p, \ldots, 2, 1\}$. A filtered output 75 is sent from adder 74 to amplifier 76, which provides gain adjustment and calibration to the filtered output 75, resulting in an average time difference z(k,k−2p−1), as indicated by arrow 77, and an estimated level-crossing time interval output, represented by box 78.

In this embodiment, the time difference between two consecutive time samples, y(k,1), is obtained by using counter 63, which is reset to zero at the level-crossing time k−1 and starts to count the oscillation cycles of the local oscillator 62. When the next level-crossing time k is detected, the counter 63 reports the value of y(k,1) to shift registers 22A–22D before being reset to zero for the next measurement. The number of cycles recorded by y(k,1) is converted and calibrated to a time scale by using a constant K. The frequency of the local oscillator 62 is much higher than the frequency of signal g(x) 11 in order to have a good time resolution. The sequence of time difference samples y(k,1),y(k−1, 1), . . . y(k−2p,1), are time interval inputs 64 to the filtering means 72. The 2p number of shift registers 22A–22D and coefficients of {1,2, . . . ,p,p+1,p, . . . , 2,1} estimate the average level-crossing time difference z(k,k−2p−1), represented by arrow 75, with amplifier 76 being used for gain adjustment and calibration. The estimated level-crossing time interval output 78 of the one-step differential level-crossing time-interval estimator of the present invention is more accurate than prior art estimation techniques because of the higher number of samples used. The filtering means 72 may be a FIR filter.

Figure 8:
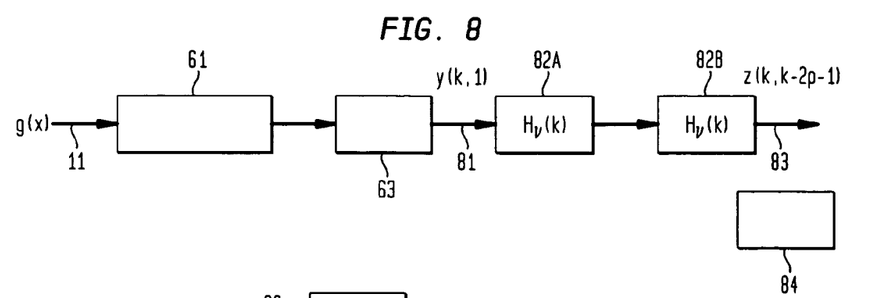
FIG. 8 is a flow diagram depicting a simplified addition only one-step differential level-crossing time-interval estimator device.
Figure 9:
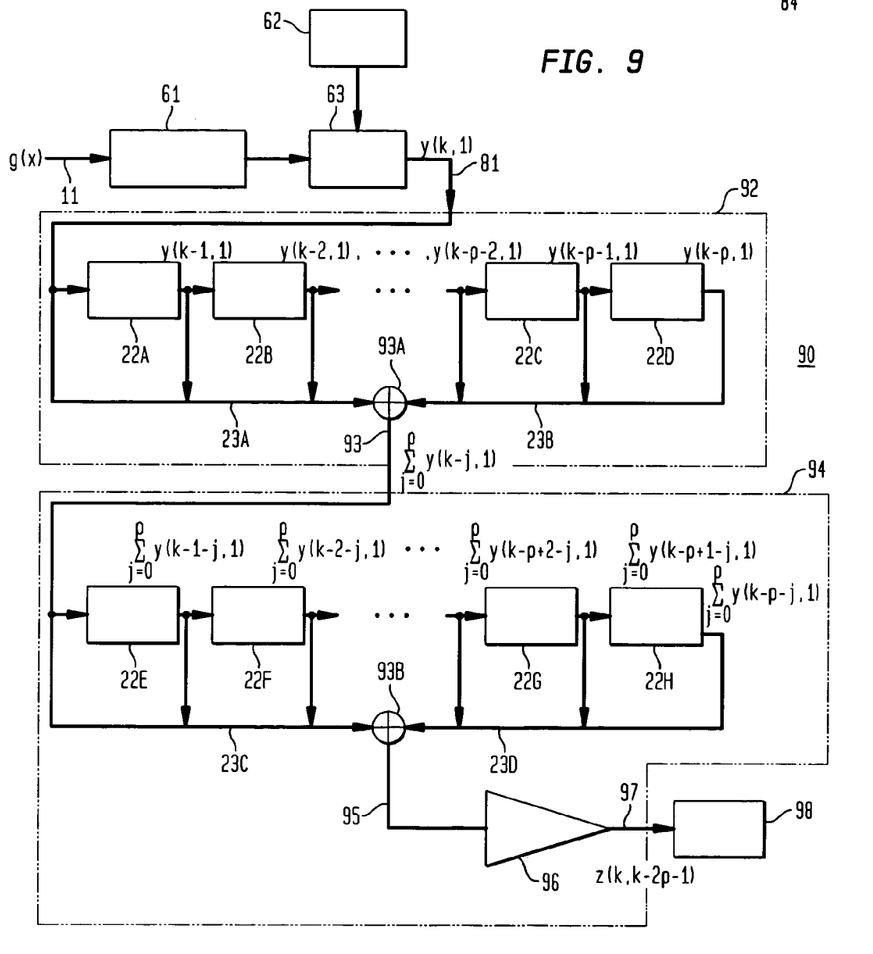
FIG. 9 is a flow diagram depicting an addition only one-step differential level-crossing time-interval estimator device with two cascade moving average FIR filters in accordance with the present invention.

Yet another variation of the estimation devices of the present invention is provided by the addition-only one-step differential N-sample time interval estimators depicted in FIGS. 8 and 9. FIG. 8 is a conceptual flow diagram depicting a simplified addition-only one-step differential N-sample time interval estimator, comprising a signal g(x) 11 being sent to a level-crossing detector 61, a counter 63, and two means for filtering 82A and 82B. Here, the time difference between two consecutive time samples, y(k,1), is obtained by using counter 63 to provide an input 81 to the filtering means 82A and 82B, for estimating the average level-crossing time difference z(k,k−2p−1), represented by arrow 83, resulting in an estimated level-crossing time interval output 84. The filtering means 82A and 82B may be a FIR filter.

FIG. 9 depicts an addition-only one-step differential N-sample time interval estimator 90 that is a more detailed implementation of the FIG. 8 estimator, with like numerals being used for similar structures. This embodiment includes N−2 shift registers 22A–22H, N adders and no multipliers. The addition-only one-step differential N-sample time interval estimator 90 further comprises signal g(x) 11 being sent to a level-crossing detector 61, local oscillator 62, counter 63 and two means for filtering 92 and 94. The time difference between two consecutive time samples y(k,1), is obtained by using counter 63. The filtering means 92 further comprises shift registers 22A–22D, shift register outputs 23A and 23B, adder 93A and filtered output 93, which is provided to filtering means 94. The sequence of time difference samples y(k,1), y(k−1,1), ... y(k−2p,1), are used as time difference inputs 81 to two filtering means 92 and 94, which can be cascade moving average FIR filters, both with p number of shift registers and coefficients of {1, 1 ..., 1}, to estimate the average level-crossing time difference z(k, k−2p−1), represented by arrow 97 with amplifier 96 in the second filtering means 94 being used for gain adjustment and calibration and resulting in an estimated level-crossing time interval output 98. The filtering means 94 further comprises shift registers 22E–22H, shift register outputs 23C and 23D, adder 93B and filtered output 95, which is provided to the amplifier 96.

To avoid using multipliers and to further simplify the computation, one can replace y(k−i,p+1) in Equation 8 with $$\sum_{j=0}^{p} y(k-i-j, 1)$$

which yields:

$$z(k, k-2p-1) = \frac{1}{(p+1)^2} \sum_{i=0}^{p} \sum_{j=0}^{p} [y(k-i-j, 1)] \quad (10)$$

The N-sample estimation in Equation 10 actually involves a two-stage estimation. The first stage is:

$$m(k-i, p+1) = \frac{1}{p+1} \sum_{j=0}^{p} [y(k-i-j, 1)] = \frac{1}{p+1} y(k-i, p+1) \quad (11)$$

which processes the two-sample estimation of level-crossing time interval defined in Equation 4 and the second stage is:

$$z(k, k-2p-1) = \frac{1}{p+1} \sum_{i=0}^{p} m(k-i, p+1) \quad (12)$$

and processes a moving average of two-sample estimations: m(k,p+1), ... m(k−p,p+1). If one chooses μ(j)={1, 1, ..., 1}, Equation 9 will be equivalent to Equation 3, making the two-sample approach a special case of N-sample approach. The addition-only one-step differential N-sample estimator in Equation 8 can be implemented by feeding y(k,1) through two cascade moving average FIR filters 82A and 82B of the addition-only one-step differential N-sample time interval estimator shown in FIG. 8. The filtering means 92 and 94 can be cascade moving average FIR filters or FIR filters.

These embodiments of the present invention are intended to be illustrative and not limiting with respect to the variety of possible embodiments. It is to be further understood that other features and modifications to the foregoing detailed description of the estimating methods and devices are all considered to be within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

I claim:

1. A method for two-mean estimating level-crossing time intervals and signal frequencies, comprising the steps of:

collecting a plurality of time difference samples from a signal g(x), said plurality of time difference samples further comprising N=2p+1 number of consecutive time samples x(k), x(k−1), ... x(k−2p−1), where said p=1,2 ... and is a positive integer, and a plurality of noises;

generating a time sequence input for a means for filtering from said plurality of time difference samples;

calculating a time interval estimate output in said filtering means, said filtering means having 2p+1 number of shift registers, a group of adders and a set of coefficients {−1, −1, ..., 1, 1}, said time interval estimate output having the formula:

$$z(k, k-2p-1) = \frac{1}{(p+1)^2} \sum_{j=0}^{2p+1} \alpha(j) x(k-j)$$

calculating an N-sample level crossing time interval having the formula:

$$z(k, k-2p-1) = \frac{1}{(p+1)^2} \left[ \sum_{i=0}^{p} x(k-i) - \sum_{i=0}^{p} x(k-i-p-1) \right]$$

providing a plurality of shift register outputs from said shift registers to said adders;

generating an increased accuracy N-sample level-crossing time interval estimate from estimating said N-sample level crossing time interval by two mean values, $$\sum_{i=0}^{P} x(k-i) \text{ and } \sum_{i=0}^{P} x(k-i-p-1),$$

and averaging out said plurality of electronic noises; and sending a filtered output to an amplifier, said filtered output including said increased accuracy N-sample level-crossing time interval estimate;

calibrating and gain adjusting said filtered output; and providing an average time difference z(k,k−2p−1) and an estimated level-crossing time interval output from said increased accuracy N-sample level-crossing time interval estimate.

2. The method for two-mean estimating level-crossing time intervals and signal frequencies, as recited in claim 1, further comprising the step of subtracting said second N/2 time samples from said mean value of the first N/2 time samples to average out a plurality of electronic noises from said first N/2 time samples and said second N/2 time samples to form said time sequence input.

3. The method for two-mean estimating level-crossing time intervals and signal frequencies, as recited in claim 2, further comprising the step of selecting a finite impulse response filter $H_\alpha(z)$ as said filtering means.

4. The method for two-mean estimating level-crossing time intervals and signal frequencies, as recited in claim 3, further comprising the step of operating said device with a plurality of software programs.

5. The method for two-mean estimating level-crossing time intervals and signal frequencies, as recited in claim 4, further comprising the steps of:

recording a plurality of cycles by said time difference y(k, 1); and calibrating said plurality of cycles to a time scale by a constant K.

6. The method for two-mean estimating level-crossing time intervals and signal frequencies, as recited in claim 5, further comprising the step of storing digital data in said shift registers.

7. The method for two-mean estimating level-crossing time intervals and signal frequencies, as recited in claim 6, further comprising the steps of:

controlling each one of said shift registers with a timing clock to shift out a plurality of stored data as an output; and storing a plurality of additional data from said time sequence input.

8. An addition only one-step differential level-crossing time-interval estimator device, comprising:

a signal g(x), having a signal frequency, is sent to a level-crossing detector to detect a level-crossing event;

a plurality of time difference samples, further comprising a series of time samples y(k,1),y(k−1,1), ... y(k−2p,1) and a plurality of noises, are collected;

a local oscillator, having a higher frequency than said signal frequency, functions as a timer to measure a time difference y(k, 1) between two of said plurality of time difference samples;

a counter provides a plurality of time difference inputs to a plurality of means for filtering;

each one of said filtering means, having p number of shift registers, an adder and a set of coefficients of {1,1, ... , 1} generates an addition-only differential level-crossing time interval estimated output;

said addition-only differential level-crossing time interval estimated output being processed in two stages, a two-sample estimate of a level-crossing time interval being processed according to a first stage equation:

$$m(k-i, p+1) = \frac{1}{p+1}\sum_{j=0}^{P} [y(k-i-j, 1)] = \frac{1}{p+1} y(k-i, p+1)$$

and a moving average of a plurality of two-sample estimations m(k,p+1), ... , m(k−p,p+1) being processed according to a second stage equation:

$$z(k, k-2p-1) = \frac{1}{p+1}\sum_{i=0}^{P} m(k-i, p+1)$$

said shift registers provide a plurality of shift register outputs to said adders;

said addition-only differential level-crossing time interval estimated output averages out said plurality of noises and generates an increased accuracy differential level crossing time interval estimate in a filtered output to an amplifier; and said amplifier provides a gain adjustment and a calibration to said filtered output, resulting in an average level-crossing time difference z(k,k−2p−1) and an estimated level-crossing time interval output.

9. The addition only one-step differential level-crossing time-interval estimator device, as recited in claim 8, further comprising said filtering means being two cascade moving average finite impulse response filters.

10. The addition only one-step differential level-crossing time-interval estimator device, as recited in claim 9, further comprising said device being operated by a plurality of software programs.

11. The addition only one-step differential level-crossing time-interval estimator device, as recited in claim 10, further comprising a plurality of cycles recorded by said time difference y(k, 1) are converted and calibrated to a time scale by a constant K.

12. The addition only one-step differential level-crossing time-interval estimator device, as recited in claim 11, further comprising said adders adding two signals together electronically.

13. The addition only one-step differential level-crossing time-interval estimator device, as recited in claim 12, said shift registers storing digital data.

14. The addition only one-step differential level-crossing time-interval estimator device, as recited in claim 13, further comprising each one of said shift registers being controlled by a timing clock to shift out a plurality of stored data as an output and store a plurality of new data from said time sequence input.

15. A one-step differential level-crossing time-interval estimator device, comprising:

a signal g(x), having a signal frequency, is sent to a level-crossing detector to detect a level-crossing event;

a plurality of time difference samples, further comprising a series of consecutive time samples x(k), x(k−1), ... x(k−2p−1) and a plurality of noises, are collected;

a local oscillator, having a higher frequency than said signal frequency, functions as a timer to measure a time difference y(k, 1) between two of said plurality of time difference samples;

a counter is reset to zero at a level-crossing time k−1 and counts a plurality of oscillation cycles in said local oscillator;

a one-step differential level-crossing time interval is estimated by taking a time average of:

$$y(k,1)=x(k)-x(k-1);$$

said one-step differential level-crossing time interval is provided as a time interval input to a means for filtering;

said filtering means, having N−2 number of shift registers, an N−1 adder, an N−3 number of multipliers and an impulse response of $\mu(j)=\{1, 2, \ldots, p, p+1, p, \ldots, 2, 1\}$ generates a differential level-crossing time interval estimated output according to the equation:

$$z(k, k-2p-1) = \frac{1}{(p+1)^2} \sum_{j=0}^{2p} \mu(j)y(k-j, 1);$$

said shift registers provide a plurality of shift register outputs to said adder and said multipliers;

said differential level crossing time interval estimated output averages out said plurality of noises and generates an increased accuracy differential level crossing time interval estimate in a filtered output to an amplifier; and said amplifier provides a gain adjustment and a calibration to said filtered output, resulting in an average time difference z(k,k−2p−1) and an estimated level-crossing time interval output.

16. The one-step differential level-crossing time-interval estimator device, as recited in claim 15, further comprising said filtering means being a finite impulse response filter.

17. The one-step differential level-crossing time-interval estimator device, as recited in claim 16, further comprising said device being operated by a plurality of software programs.

18. The one-step differential level-crossing time-interval estimator device, as recited in claim 17, further comprising a plurality of cycles recorded by said time difference y(k, 1) are converted and calibrated to a time scale by a constant K.

19. The one-step differential level-crossing time-interval estimator device, as recited in claim 18, said shift registers storing digital data.

20. The one-step differential level-crossing time-interval estimator device, as recited in claim 19, further comprising each one of said shift registers being controlled by a timing clock to shift out a plurality of stored data as an output and store a plurality of new data from said time sequence input.

* * * * *